United States Patent [19]

Uchida et al.

[11] Patent Number: 4,944,542

[45] Date of Patent: Jul. 31, 1990

[54] SUPPORT DEVICE

[75] Inventors: Mizuki Uchida; Kozo Hara, both of Yamanashi, Japan

[73] Assignee: Tel Yamanashi Limited, Nirasaki, Japan

[21] Appl. No.: 254,183

[22] Filed: Oct. 6, 1988

[30] Foreign Application Priority Data

Oct. 7, 1987 [JP] Japan .................. 62-253226

[51] Int. Cl.⁵ .......... B65G 47/00; B66C 1/42
[52] U.S. Cl. .................... 294/86.4; 294/88; 294/119.1; 294/902; 294/907; 414/589; 414/608
[58] Field of Search ............ 294/2, 86.4, 65, 81.5, 294/81.6, 87.1, 902, 88, 119.1, 81.2, 907; 269/13, 903; 414/589, 608, 609, 751, 940

[56] References Cited

U.S. PATENT DOCUMENTS

| | | | |
|---|---|---|---|
| 1,973,098 | 9/1934 | Pride | 414/608 |
| 3,757,961 | 9/1973 | Jacobs | 414/751 X |
| 4,557,371 | 12/1985 | Yonezawa | 294/87.1 X |
| 4,563,031 | 1/1986 | Kishimoto et al. | 294/87.1 X |
| 4,568,234 | 2/1986 | Lee et al. | 414/751 X |

FOREIGN PATENT DOCUMENTS

| | | |
|---|---|---|
| 55-85038 | 6/1980 | Japan . |
| 61-131836 | 8/1986 | Japan . |
| 1358831 | 7/1974 | United Kingdom ........ 414/751 |

Primary Examiner—Johnny D. Cherry
Attorney, Agent, or Firm—Oblon, Spivak, McClelland, Maier & Neustadt

[57] ABSTRACT

A support device of the present invention includes an expansible means attached to at least one of plural support systems for supporting an object. Even when the object has dimensional errors caused in its making process, therefore, the interval between the support systems which contact the object to be supported can be self- and micro-adjusted. This enables objects, different in shape, to be correctly positioned and supported.

12 Claims, 5 Drawing Sheets

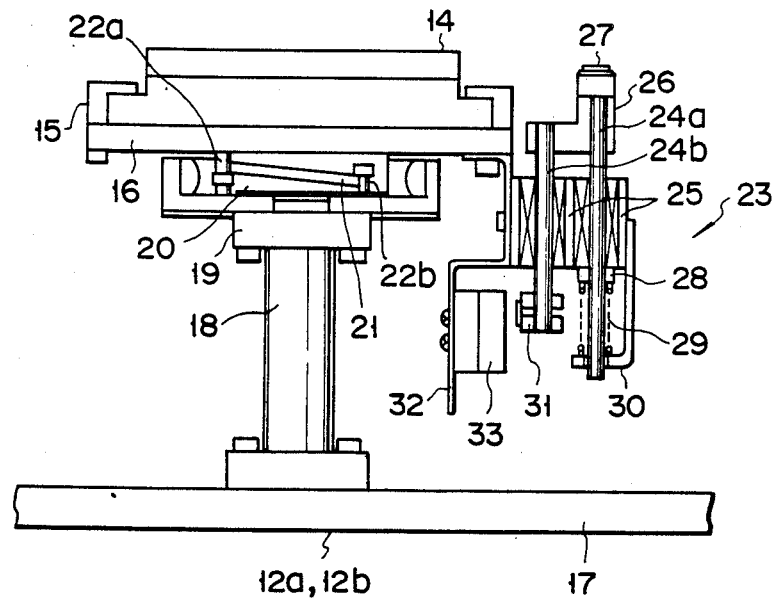
F I G. 3
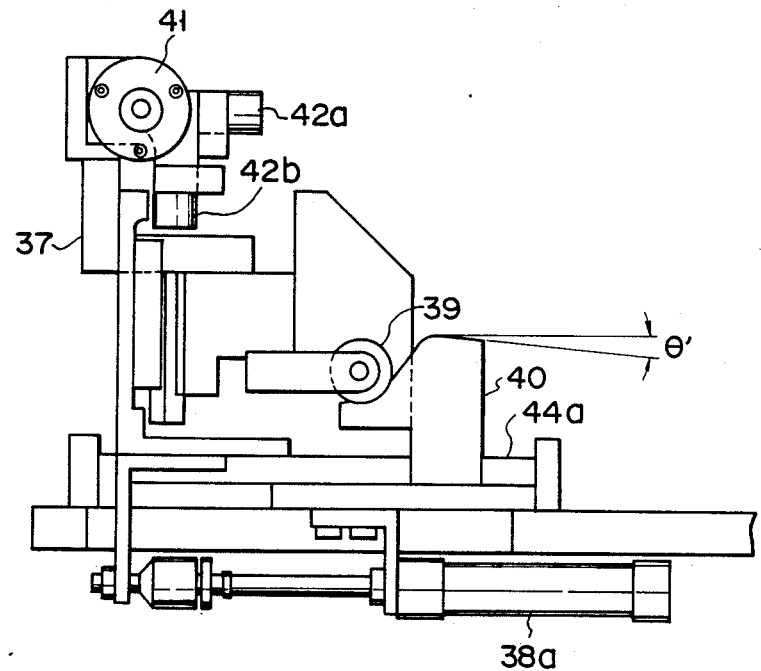
F I G. 4

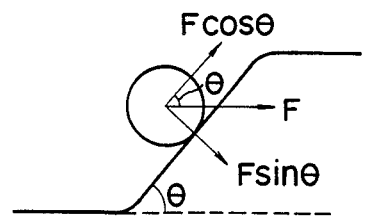
F I G. 7A
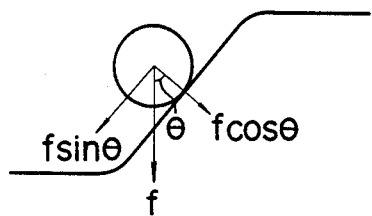
F I G. 7B
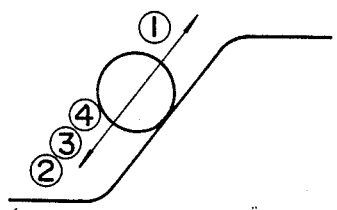
F I G. 7C

SUPPORT DEVICE

BACKGROUND OF THE INVENTION

1. Field of the Invention:

The present invention relates to a support device.

2. Description of the Related Art

Various kinds of thin films are formed on semiconductor wafers (which will be hereinafter referred to as wafers) in the process of manufacturing semiconductor devices. The forming of these films is carried out by locating a wafer boat on which many wafers are mounted in a reaction furnace or the like. 100 or 150 pieces of the wafers, for example, are mounted on the wafer boat at certain intervals. These wafers are transferred from a wafer cassette to the wafer boat. The wafer cassette is used as transporting means for wafers in a semiconductor element manufacturing process. The shape of the wafer boat is made suitable for a thin film forming device such as a reaction furnace.

The boat is taken out of the reaction furnace after the thin films are formed on the wafers in the furnace and the wafers on which the thin films have been formed are then transferred from the boat to their cassette, which is carried to a next process. There are two types of reaction furnaces. One of them is a horizontal type provided with a horizontal central axis. The other is a vertical type provided with a vertical central axis. These processes are automated.

The boat is supported on a support device and reciprocated between a wafers-transferring position and a boat-delivering position. The wafers-transferring position is that where the wafers are transferred from their cassette to the boat or from the boat to their cassette while the boat-delivering position denotes that position which is on an elevator which serves to carry the boat into or out of the reaction furnace, for example.

The reason why the boat is reciprocated while being supported on the support device is that the boat must be correctly positioned at boat-carrying, wafers-transferring and boat-delivering times.

FIG. 1 shows an arrangement of the conventional boat support device. Numeral 1 represents a boat made of quartz glass. When it is made of quartz glass, boat 1 has adequate heat-resistance. A plurality of grooves having a certain interval between adjacent ones are formed on both sides of boat 1 along the longitudinal direction thereof. Wafers 2 are fitted into these grooves at both their sides.

Boat 1 is mounted on boat supports 5 which form boat carrying system 3. Boat 1 is held between support members 6 which form boat support device 7 in such a way that support members 6 are pressed from outside against both ends of boat 1. Boat 1 is released from support members 6 when support members 6 separate from both ends of boat 1. Boat supports 5 are erected on movable plate 4 which is mounted on boat carrying system 3. Boat carrying system 3 reciprocates on rails 8 between the wafers-transferring and boat-delivering positions. While boat carrying system 3 is moving, boat 1 is supported on boat supports 5 and held between support members 6.

Boat 1 is positioned on boat carrying system 3 by controlling those cylinders (not shown) for lifting boat supports 5 and reciprocating support members 6.

However, all boats 1 are not necessarily the same in their shape, because of manufacturing errors. In other words, every boat supported and carried on the boat support device differs a little from the others in shape. Even when each of the cylinders is driven by such strokes as needed to correctly position boat 1 on boat carrying system 3, therefore, it sometimes happens that support members 6 cannot contact boat 1 or that they contact boat 1 too strongly. When support members 6 are left not contacted with boat 1, boat 1 cannot be positioned correctly and when they contact boat 1 too strongly, it may be broken.

When boat 1 cannot be positioned correctly, it becomes difficult to automatically transfer plural wafers 2 into their grooves respectively from their cassette to boat 1. As a result, it becomes difficult to automate the process of manufacturing semiconductor devices. Further, the throughput in the process of manufacturing semiconductor devices is thus made low.

SUMMARY OF THE INVENTION

An object of the present invention is therefore to provide a support device capable of correctly positioning an object supported on it so as to automate the process of transferring pieces from their cassette to the object or from the object to their cassette.

According to the present invention, there can be provided a support device comprising plural mounts on which an object is mounted, a means for lifting at least one of the mounts, a pair of support systems opposed to each other keeping the interval variable between them, driver means for driving the support systems to set the interval between them compensating a distance of which the support systems moved, a single contact arranged at the support systems to contact one end face of the object, a plurality of contacts arranged at the other of the support systems to contact the other end face of the objects, and expansible means for compensating for a distance moved by the support system in synchronization with an abutment of said single contact and said plurality of contacts against the end faces of said object.

According to this support device of the present invention, the expansible means is attached to at least one of the plural support systems on which the object is supported. Even when the object has any dimensional errors caused in its making process, therefore, it can be supported on the support systems at a certain position because its position can be finely adjusted by the expansible means. Its positioning can thus be attained with higher accuracy, thereby enabling it to be correctly supported on the support systems.

Further, the fact that the object can be positioned with higher accuracy prevents the object from being broken because of its incorrect support.

BRIEF DESCRIPTION OF THE DRAWINGS

FIG. 3 show a mount;

FIG. 4 shows a support system;

FIG. 7A shows a force caused by the air cylinder;

FIG. 7B shows a force caused by the spring; and

FIG. 7C shows forces caused by the air cylinder and the spring, and shows a rolling friction caused by the coil spring.

DETAILED DESCRIPTION OF THE PREFERRED EMBODIMENT

An embodiment of the present invention will be described with reference to the accompanying drawings.

Figure 1:
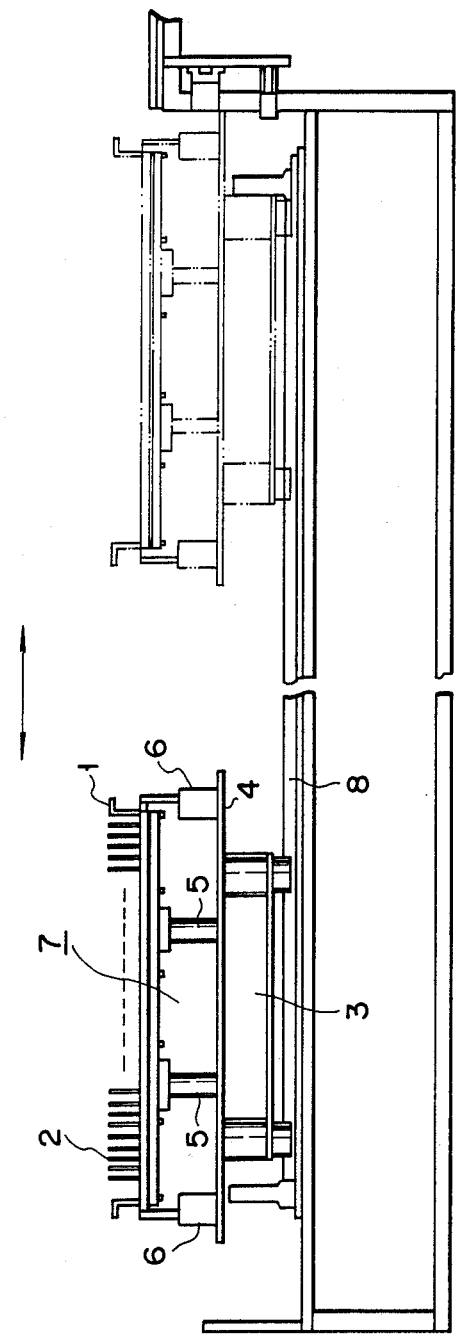
FIG. 1 shows the conventional boat support device.
Figure 2:
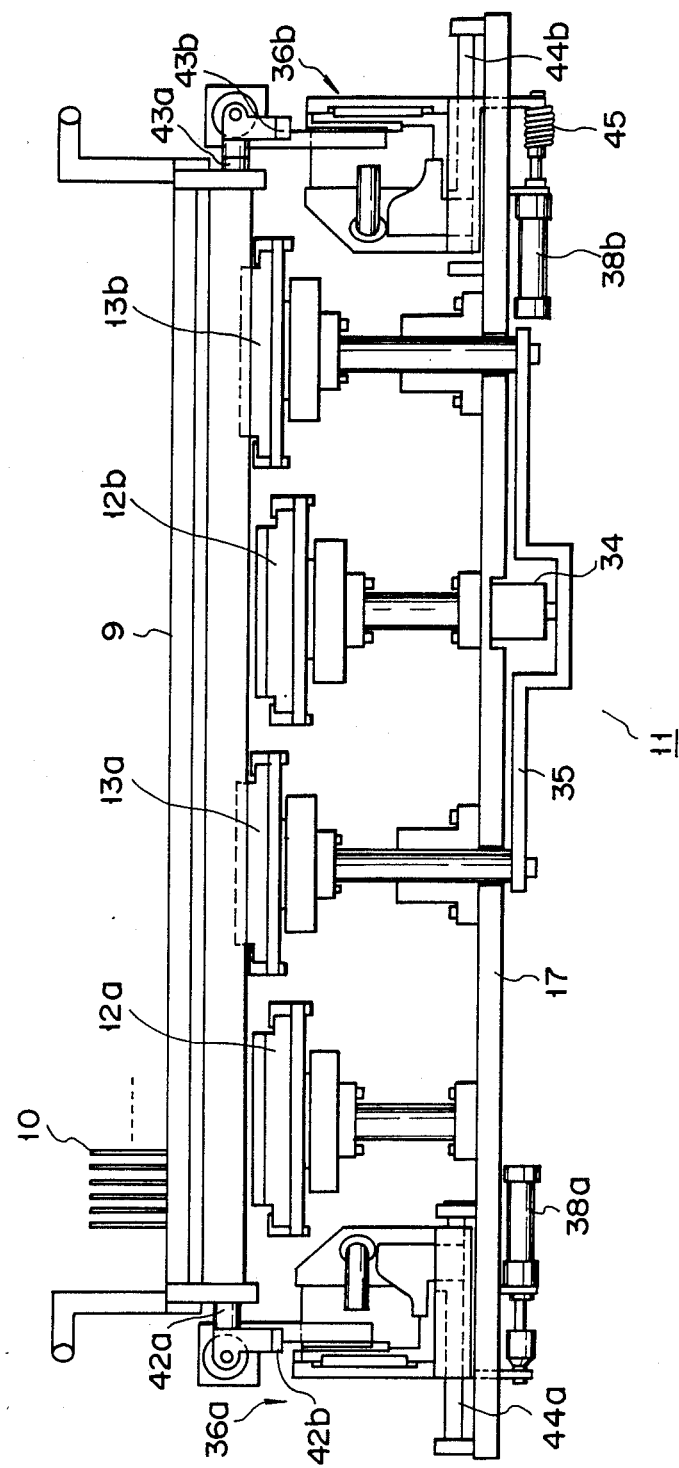
FIG. 2 shows an example of the boat support device according to the present invention.

FIG. 2 shows an example of the boat support device according to the present invention, which serves as the boat support system for semiconductor wafers (or wafers). Numeral 9 represents a wafer boat made of a heat-resistant material such as SiC or quartz glass. A plurality of grooves (not shown) having a certain interval between adjacent ones are formed on both sides of boat 9 along the longitudinal direction thereof. Wafers 10 are fitted into these grooves at both sides thereof. 100 or 150 pieces of wafers 10, for example, can be housed in wafer boat 9.

Boat 9 in which wafers 10 are housed is supported by boat support device 11 which has the following arrangement, and it is reciprocated between wafers-transferring and boat-delivering positions.

Boat support device 11 has four mounts 12a, 12b, 13a and 13b, for example, on which boat 9 is mounted. Every two of these mounts 12a, 12b, 13a and 13b are made as a pair and boat 9 is supported by all of the paired mounts.

FIG. 3 shows an arrangement of paired mounts 12a and 12b. This mount 12a or 12b has movable plate 17 which reciprocates on rails (not shown). Column 18 is erected on movable plate 17. Second base 19 is attached to the top of column 18. First base 16 is mounted on second base 19, interposing slidable member 20 between them. Quartz glass plate 14 is mounted on first base 16 and its upper face contacts the underside of boat 9. Quartz glass plate 14 is held and fixed on first base 16 by holders 15.

Slidable member 20 has first and second slidable pieces (not shown) in it. The first slidable piece is fixed to first base 16, while the second slidable piece is fixed to second base 19. The first slidable piece can freely slide in that direction in which wafers 10 are arranged.

Hook 22a is screwed into the underside of first base 16, while hook 22b is screwed into the upper face of second base 19. An urging member such as tension coil spring 21 is stretched between these hooks 22a and 22b. First base 19 is urged by tension coil spring 21 in one direction along that direction in which wafers 10 are arranged. The urging member may be a slide cylinder.

Boat detector system 23 is attached to mounts 12a and 12b. Boat detector system 23 detects the presence of the boat.

Boat detector system 23 has two shafts 24a and 24b extending in the vertical direction and having a certain interval between them. Ball bearings 25 are interposed between them. Both of them are freely movable up and down due to the presence of ball bearings 25. Their tops are connected to base 26. In short, both of them are moved together with each other up and down. Base 26 fixes shafts 24a and 24b. Switch 27 made of quartz is arranged on the top of base 26. Ring-shaped stopper 28 is attached to that area of one shaft 24a where ball bearings 25 are attached. Stopper 28 may instead be attached to the other shaft 24b. Springs 29 are attached to the underside of stopper 28, holding shaft 24a between them. The lower ends of springs 29 are hooked to spring plate 30. Both of shafts 24a and 24b are urged upward by springs 29. Magnet 31 is attached to the lower end of the other shaft 24b. Magnet sensor 33 is located to oppose magnet 31. Magnet sensor 33 is attached to mount 32 which is attached to first base 16. It is detected by magnet sensor 33 whether switch 27 is lifted or lowered. Magnet 31 may be attached to shaft 24a.

Boat detector system 23 having the above-described arrangement may be arranged on every set of paired mounts 12a, 12b and 13a, 13b. Or it may be arranged on every mount.

One pair of mounts 12a, 12b have the same arrangement as described above. The other pair of mounts 13a and 13b are connected to cylinder 34 through arm 35 and moved up and down by cylinder 34. Cylinder 34 is attached to the underside of movable plate 17.

Mounts 12a, 12b, 13a and 13b are linearly arranged along the longitudinal direction of boat 9, enabling their tops to be contacted with the underside of boat 9. Fixed mounts 12a and 12b are arranged alternately with those 13a and 13b which are freely moved up and down. This is because boat 9 must be mounted on mounts 12a, 12b, 13a and 13b as stably as possible.

Boat support device 11 has support systems 36a and 36b for holding both ends of boat 9. As shown in FIG. 4, support systems 36a and 36b have support members 37 which contact both ends of boat 9. Support members 37 are slid by drive means 38a and 38b. Support members 37 also serve to guide support systems 36a and 36b while the latter are being moved. Support systems 36a and 36b are provided with cam followers 39 which move together with support members 37. Support systems 36a and 36b are also provided with cams 40 along which cam followers 39 are moved.

Support member 37 has a contact switching system at the upper end thereof. The contact switching system includes rotary solenoid 41, for example. Two contacts 42a and 42b, for example, forming an angle of 90° are attached to support member 37. Contacts 42a and 42b are made of quartz to have sufficient heat-resistance. Rotary solenoid 41 causes contacts 42a and 42b to be swung and one of them to be contacted with the end face of boat 9.

Figure 5:
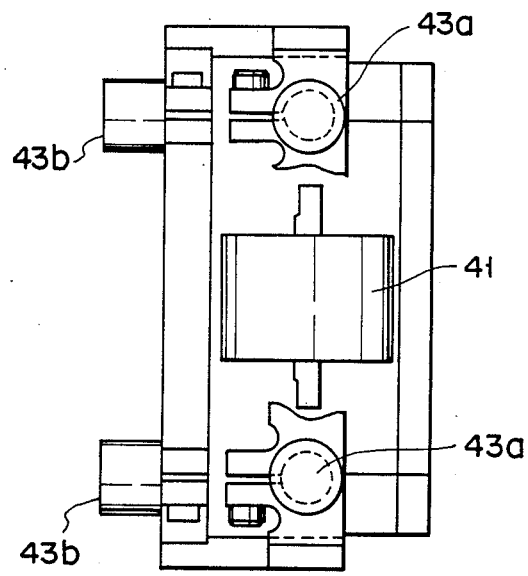
FIG. 5 shows a contact arranged at one of the support systems.

Support member 37 which is included in one support system 36a is provided with a single set of two contacts 42a and 42b, while support member 37 which is included in the other support system 36b is provided with pairs of two contacts 43a, 43a and 43b, 43b (see FIG. 5). In short, one of contacts 42a and 42b in one support system 36a and one pair of contacts 43a, 43a and 43b, 43b in the other support system 36b are contacted with both ends of boat 9 so that boat 9 can be held at three points.

Boat 9 may be held by contacts 42a, 42b, 43a and 43b at four points. However, it sometimes practically happens that both end faces of boat 9 are not parallel to each other. It is extremely difficult in this case that boat 9 can be correctly supported by the four-point support. In the worst case, boat 9 cannot be correctly positioned because of the four-point support, thereby causing boat 9 to be unstably held by support members 37. As a result, wafers cannot be smoothly transferred between their cassette and boat 9. Taking the above into consideration, one of contacts 42a and 42b is contacted with one end face of boat 9 substantially at the center thereof, while two of contacts 43a, 43a and 43b, 43b are contacted with the other end face of boat 9 at those two points which are equal from the center of the other end face. As a result, boat 9 can be correctly positioned and reliably held by support systems 36a and 36b at three points.

The other support member 37 to which two pairs of contacts 43a and 43b and the rotary solenoid are attached is attached to a rotating shaft (not shown) erected on movable plate 17. Support member 37 rotates round this shaft through which a plate spring is passed.

As described above, one end face of boat 9 is pressed by one of contacts 42a and 42b while the other end face thereof by two of freely-rotatable contacts 43a and 43b. As a result, any boats 9, different in shape, can be correctly positioned under stable state.

Support members 37 are slid by drive means 38a and 38b, which are air cylinders, for example, and which are attached to the underside of movable plate 17 under their respective support members 37. Drive means 38a and 38b cause support systems 36a and 36b to be slid along guides 44a and 44b.

Figure 6:
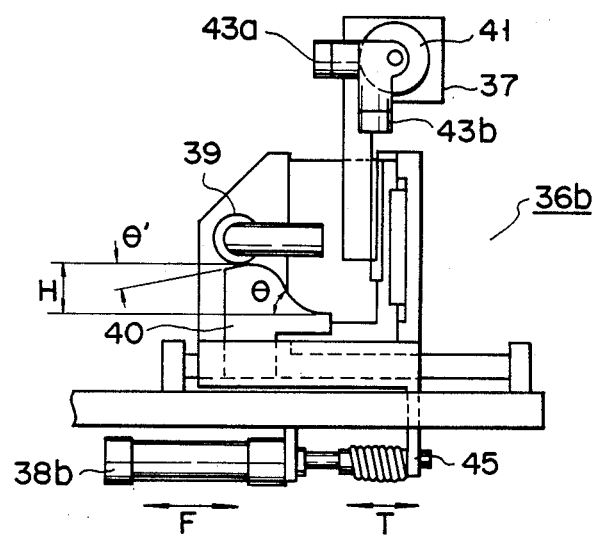
FIG. 6 shows an expansible means attached.

As shown in FIG. 6, an expansible means which is expanded in the longitudinal direction of boat 9 and which is coil spring 45, for example, is attached to at least one of drive means 38a and 38b. Coil spring 45 is attached to the piston rod of the air cylinder, for example, which serves as the drive means 38b. The position at which the expansible means is attached may be such that the interval between support members 37 and 37 can be freely adjusted by drive means 38a and 38b.

It will now be described what coil spring should be selected as coil spring 45 attached to the piston rod of the air cylinder. It is determined by the force with which cam follower 39 goes up cam 40.

It is assumed that the spring force f of a coil spring (not shown) is arranged in support system 36b to urge support member 37 downward. It is also assumed that the component force of spring force f and of force F of drive means 38b which acts on a slope having an angle of $\theta$ is smaller than that of tension force T of coil spring 45 which also acts on the slope. Coil spring 45 can advance in the direction of the slope in this case, without its being expanded. Resultant W of forces acting along the slope will be now calculated.

As shown in FIG. 7A, force caused by the air cylinder is expressed to be $F\cos\theta$—(1), and when the friction factor is assumed to be $\mu$, rolling friction caused by the air cylinder is expressed to be $F\sin\theta$—(2). As shown in FIG. 7B, force caused by the spring is expressed to be $f\sin\theta$—(3), and rolling friction caused by the coil spring is expressed to be $\mu f\cos\theta$—(4). These forces are as shown in FIG. 7C. Therefore, forces W acting along the slope can be expressed as follows:

$$W = F\cos\theta - \mu F\sin\theta - f\sin\theta - \mu f\cos\theta$$
$$= F(\cos\theta - \mu\sin\theta) - f(\sin\theta + \mu\cos\theta)$$

The force of coil spring 45 acting on the slope is expressed to be $T\cos\theta$. In order that coil spring 45 is expanded when boat 9 is supported, tension force T must be smaller than force F of the cylinder. Therefore, $W < T\cos\theta$, $T < F$. When it is assumed this time that the diameter of the cylinder be d, air pressure in the cylinder P, spring constant of the coil spring (not shown) arranged in support system 36b K1 and expansion of the spring x, (when two springs are used)

$$F = \frac{\pi}{4} d^2 P, f = 2k_1 x$$

(when two springs are used in parallel)

$$\therefore W = \frac{\pi}{4} d^2 P\cos\theta - 2k_1 x\sin\theta - \mu\frac{\pi}{4} d^2 P\sin\theta - 2\mu k_1 x\cos\theta$$
$$= \left(\frac{\pi}{4} d^2 P - 2\mu k_1 x\right)\cos\theta - \left(2k_1 x + \mu\frac{\pi}{4} d^2 P\right)\sin\theta$$

When $W < T\cos\theta$ and $T < F$ are used, $$T > \frac{\pi}{4} d^2 P - 2\mu k_1 x - \left(2k_1 x + \mu\frac{\pi}{4} d^2 p\right)\tan\theta$$

$$T < \frac{\pi}{4} d^2 P$$

A coil spring having a spring force which is in the above-calculated range is selected as the one 45.

When coil spring 45 thus selected is used, intervals between contacts 42a and 43a which contact both end faces of boat 9 or between contacts 42b and 43b which contact both end faces of boat 9 can be set to a value most suitable for the shape of boat 9. Namely, the intervals between contacts 42a and 43a or between 42b and 43b are previously set to be a little shorter. When strokes of cylinders 38a and 38b relative to boat 9 are longer than needed, the longer strokes can be absorbed by expansible coil spring 45.

Cam followers 39 are connected to support members 37 through cam follower supports. Cam followers 39 move along cams 40, causing support members 37 to move obliquely upward and hold boat 9 between them. When boat 9 is held between them, cam followers 39 move obliquely downward along the angle $\theta'$.

Support members 37 are urged downward in the vertical direction by urging members (not shown) to reliably keep cam followers 39 contacted with cams 40.

It will now be described how boat 9 is supported by support device 11 which has the above-described arrangement.

Boat support device 11 is located at the boat-delivering position. Boat support device 11 moves together with movable plate 17 which can move on the rails (not shown). The elevator (not shown) for carrying boat 9 into and out of the reaction furnace, for example, is arranged at the boat-delivering position. The elevator puts boat 9 on a pair of mounts 12a and 12b, for example.

Support systems 36a and 36b are left inoperative at the time when boat 9 is put on mounts 12a and 12b. Therefore, mounts 12a and 12b are urged by tension coil springs 21 in one side in that direction in which they are arranged. When movable plate 17 is stopped on the rails at the predetermined position, therefore, those planes of mounts 12a and 12b on which boat 9 is mounted are readily determined by the urging force of springs 21. Boat 9 can be thus accepted on the planes of the mounts which are usually at the same positions.

When boat 9 is mounted on mounts 12a and 12b, switches 27 of boat detector systems 23 are lowered, causing magnets 31 to be lowered accordingly. Magnet sensors 33 thus detect the mounting of boat 9. When the mounting of boat 9 is detected, support systems 36a and 36b are made operative and drive means 38a and 38b are thus rendered operative. Contacts 42a and 43a move to contact both end faces of boat 9. When contacts 42a and 43a contact both end faces of boat 9, cam followers 39 follow cams 40, each of which is tilted obliquely downward at an angle of $\theta'$. Contacts 42a and 43a apply pushing forces toward boat 9 and the resultant of these pushing forces is directed obliquely downward. A component force which is directed downward in the vertical direction is thus caused.

Frictional force caused between boat 9 and mounts 12a, 12b is the product of the vertical component force which is relative to the angle $\theta$ and which vertically acts on the friction planes, and of the friction factor. The frictional force is thus increased by the component force directed downward in the vertical direction.

The boat-positioning and -supporting force acts on boat 9, as described above. Boat 9 is moved in that direction in which the force is directed. Substantial frictional force is caused this time between boat 9 and mounts 12a, 12b. Therefore, no sliding is caused between them. When slidable members 20 slide against tension coil springs 21, boat 9 can be positioned and supported.

When boat 9 is positioned and supported in this manner, no sliding is caused between quartz glass plates 14 on mounts 12a and 12b and boat 9. This can prevent dust from being caused to reduce the productivity of wafers. This can also prevent wafers from being damaged.

Even when boat 9 has dimensional errors in the longitudinal direction thereof, it can be correctly positioned by the action of expansible spring 45.

Boat support device 11 is then moved to the wafers-transferring position where the wafers are transferred from boat 9 to their cassette.

If the position of movable plate 17 stopped is correctly controlled, wafers 10 in boat 9 can be reliably transferred from boat 9 to their cassette by means of an automated means because boat 9 has been positioned on mounts 12a and 12b.

When the above process is finished, a wafer cassette in which new wafers ar housed is located at the wafers-transferring position. Wafers 10 are similarly transferred from their cassette to boat 9, which is then moved to the boat-delivering position and released from the pushing forces applied from contacts 42a and 43a. Boat 9 is then delivered to the elevator and carried by the elevator into the reaction furnace.

There is a case where the conditions under which wafers have been treated in the reaction furnace are different from those under which a next group of wafers will be treated in the furnace. Reaction gas which will be used in the furnace is naturally different from the one which was previously used there. When the same boat is used in these different treatments, the reaction gas which adhered to the boat in the previous treatment will react with the one which will be used in the next treatment, thereby giving bad influence to the wafers to be treated. Therefore, the boat used is replaced by a boat which is suitable for the next treatment or a new boat after the wafers which were treated in the previous treatment are transferred to their cassette.

Further, the reaction gas which was used in the previous treatment has adhered to mounts 12a, 12b and contacts 42a, 43a of boat support device 11 because these mounts and contacts were contacted with boat 9 to position and support the latter. Therefore, mounts 12a, 12b and contacts 42a, 43a must be exchanged with the others. The exchange of mounts 12a and 12b is carried out in such a way that mounts 13a and 13b are lifted higher than mounts 12a and 12b by means of cylinder 34. On the other hand, contacts 42a and 43a are exchanged over contacts 42b and 43b by means of rotary solenoids 41. As described above, mounts 13a and 13b newly exchanged are set higher than their normal position. Contacts 42b and 43b are also lifted accordingly, corresponding to mounts 13a and 13b which have been set higher. This enables the next boat to be positioned and supported by the mounts and contacts under the same condition as the previous boat was.

The wafers are then transferred from their new cassette to the boat which has been positioned and supported by mounts 13a, 13b and contacts 42b, 43b, and the boat is carried into the furnace.

The course of the above-described processes will be thereafter repeated, considering the conditions under which the wafers will be treated.

When boat 9 is fixed by support members 37, air is supplied to drive means or cylinder 38a provided with coil spring 45 which has a desired spring force, to move support members 37 toward boat 9 so as to correctly position boat 9. The stroke of the cylinder is previously set this time to position support members 37 in such a way that support members 37 opposed to each other, sandwiching boat 9 between them, have a little shorter interval between them than the length of boat 9, or that the interval between contacts 42a and 43a or between contacts 42b and 43b becomes a little shorter than the length of boat 9. While keeping the cylinder set like this, support members 37 are driven toward boat 9. Contacts 42a and 43a or 42b and 43b are contacted with both ends of boat 9 to hold it between them and coil spring 45 is extended to absorb the difference between the previously-set stroke end of the cylinder and the length of boat 9.

Since the stroke end of the cylinder is previously set to make shorter the interval between support members 37, between contacts 42a and 43a, or between contacts 42b and 43b than the length of boat 9, as described above, any boats, different in shape because of their manufacturing errors, can be correctly positioned and supported due to coil spring 45.

Although cylinders have been used as the drive means in the above-described embodiment of the present invention, they may be solenoids, motors or the like.

Although a coil spring has been used as the expansible means, any expansible systems may be used instead.

Although the present invention has been described with reference to the case of supporting the semiconductor wafer boat which is employed in the process of manufacturing semiconductors, it can be applied to any of those cases where an object is supported by a robot or the like. Further, the semiconductor wafer boat has been supported at its both end faces in the above-described embodiment but it may be supported in four directions. Or any of other objects may be supported in plural directions by the support device of the present invention. Or the object to be supported by the support device of the present invention may be shaped like a circle, sphere or the like.

What is claimed is:

1. A support device comprising:
   plural mounts on which an object to be supported is mounted,
   a means for lifting at least one of said mounts,
   a pair of support systems opposed to each other and having a variable interval between them,
   drive means for moving said support systems to have a predetermined interval between them, a single contact arranged at one of the support systems to contact one end face of said object, a plurality of contacts arranged at the other of said support systems to contact the other end face of said object; and expansible means for compensating for a distance moved by said support systems in synchronization with an abutment of said single contact and said plurality of contacts against the end faces of said object.

2. The support device according to claim 1, wherein said mounts comprise a pair of mounts fixed and another pair of mounts movable up and down.

3. The support device according to claim 1, wherein said mounts and support systems are arranged on a movable plate to reciprocate a predetermined interval.

4. The support device according to claim 1, wherein said drive means are air cylinders.

5. The support device according to claim 4, wherein said expansible means is a coil spring attached to one of the air cylinders.

6. The support device according to claim 1, wherein a contact is attached to one of the support systems through a support member.

7. The support device according to claim 6, wherein two kinds of contacts are attached to the support member and one of them is freely selected by rotating the support member.

8. The support device according to claim 1, wherein two contacts are attached to the other of the support systems through a support member.

9. The support device according to claim 8, wherein two kinds of contacts are attached to the support member and two of them are freely selected by rotating the support member.

10. The support device according to claim 1, wherein means for detecting the presence of said object are arranged at the mounts.

11. The support device according to claim 10, wherein said detector means include magnet sensors.

12. The support device according to claim 1, wherein said object is a boat on which a plurality of semiconductor wafers are mounted.

* * * * *